United States Patent [19]

Robinson

[11] 4,295,727
[45] Oct. 20, 1981

[54] ELECTRICAL APPARATUS FOR COMPARING DARK AND LIGHT AREAS ON A SUBSTRATE AND WHICH SUBSTRATE IS IN A LIQUID

[76] Inventor: Douglas K. Robinson, 7512 Beverly, Edmonds, Wash. 98020

[21] Appl. No.: 952,202

[22] Filed: Oct. 17, 1978

[51] Int. Cl.$^3$ .............................................. G03D 13/08
[52] U.S. Cl. ..................................... 354/298; 356/443
[58] Field of Search ................ 354/298, 324; 356/443, 356/444; 250/559

[56] References Cited

U.S. PATENT DOCUMENTS

| | | | |
|---|---|---|---|
| 2,548,573 | 4/1951 | Wampole et al. | 354/298 X |
| 3,388,652 | 6/1968 | Parrent, Jr. | 354/298 |
| 3,785,268 | 1/1974 | Gregg et al. | 354/298 |
| 4,134,664 | 1/1979 | Morokuma et al. | 354/298 |

Primary Examiner—L. T. Hix
Assistant Examiner—W. J. Brady
Attorney, Agent, or Firm—Thomas W. Secrest

[57] ABSTRACT

This invention is directed to a new apparatus to assist in the making of negatives. If the negatives are screen separation negatives, then the screen separation negatives can be used in the making of printing plates. For colored prints there are a plurality of screen separation negatives and a plurality of printing plates. With this apparatus it is possible to develop a screen separation negative to realize a predetermined dot structure. As a result, in a plurality of screen separation negatives there is a more uniform dot structure. With a more uniform dot structure in the screen separation negative there is a more uniform dot structure in the printing plate and therefore a more uniform printed color print. The apparatus indicates when the dot structure, viz., opaque area and clear area, on the developing screen separation negative reaches a predetermined standard for dot structure or a predetermined standard of transparency to light. This apparatus can be used with a continuous tone negative in the test for an opaque area and for a clear area.

15 Claims, 14 Drawing Figures

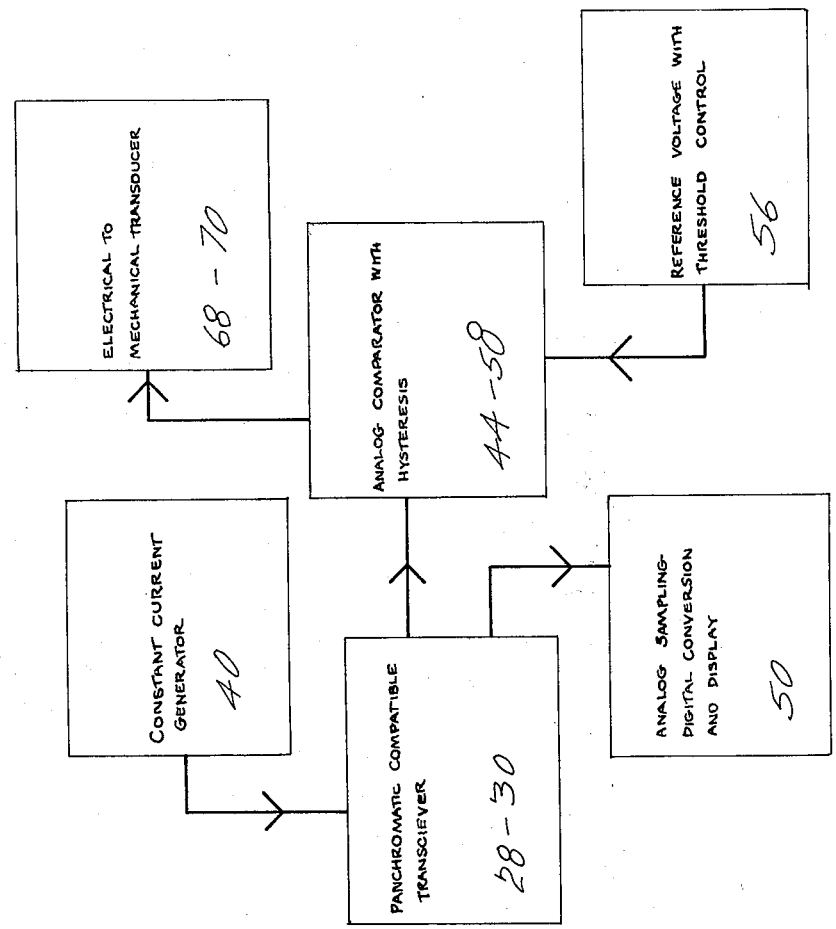
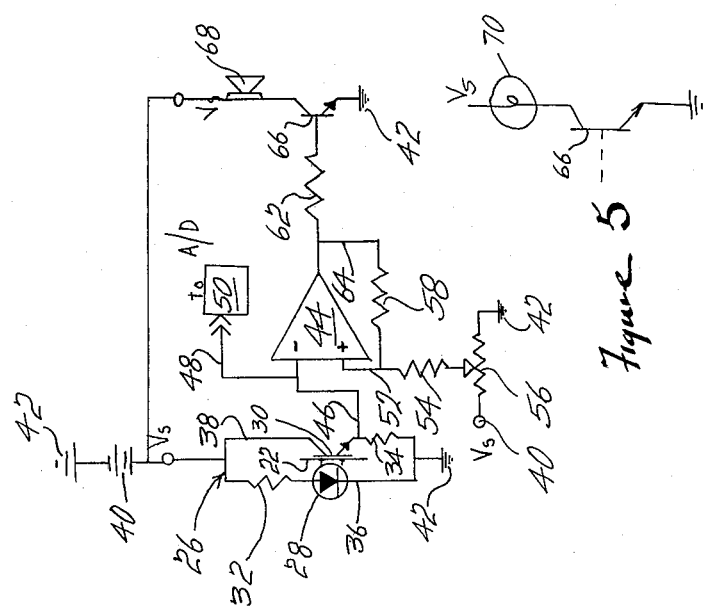
Figure 6
Figure 5

Figure 11
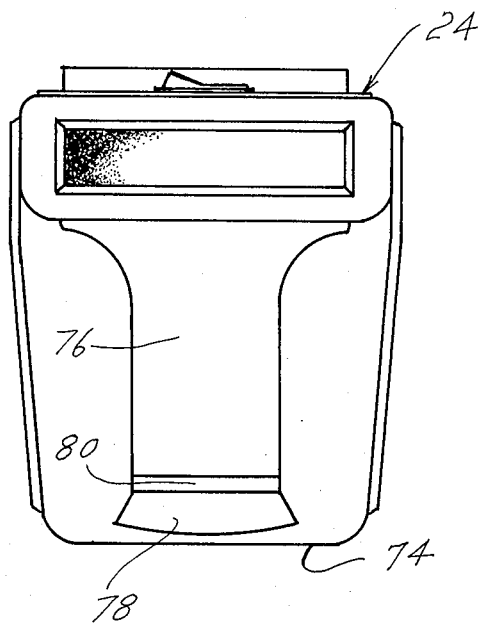
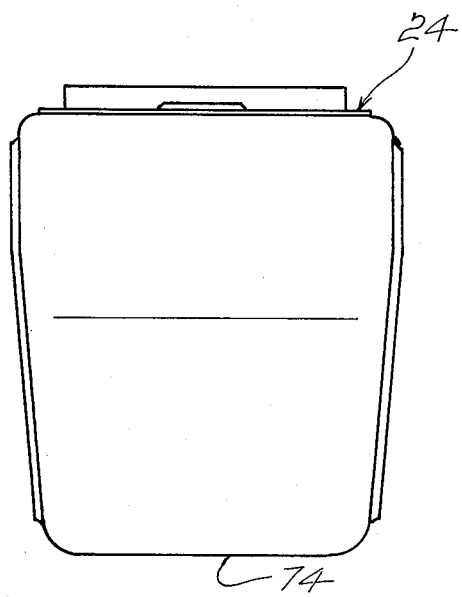
Figure 12

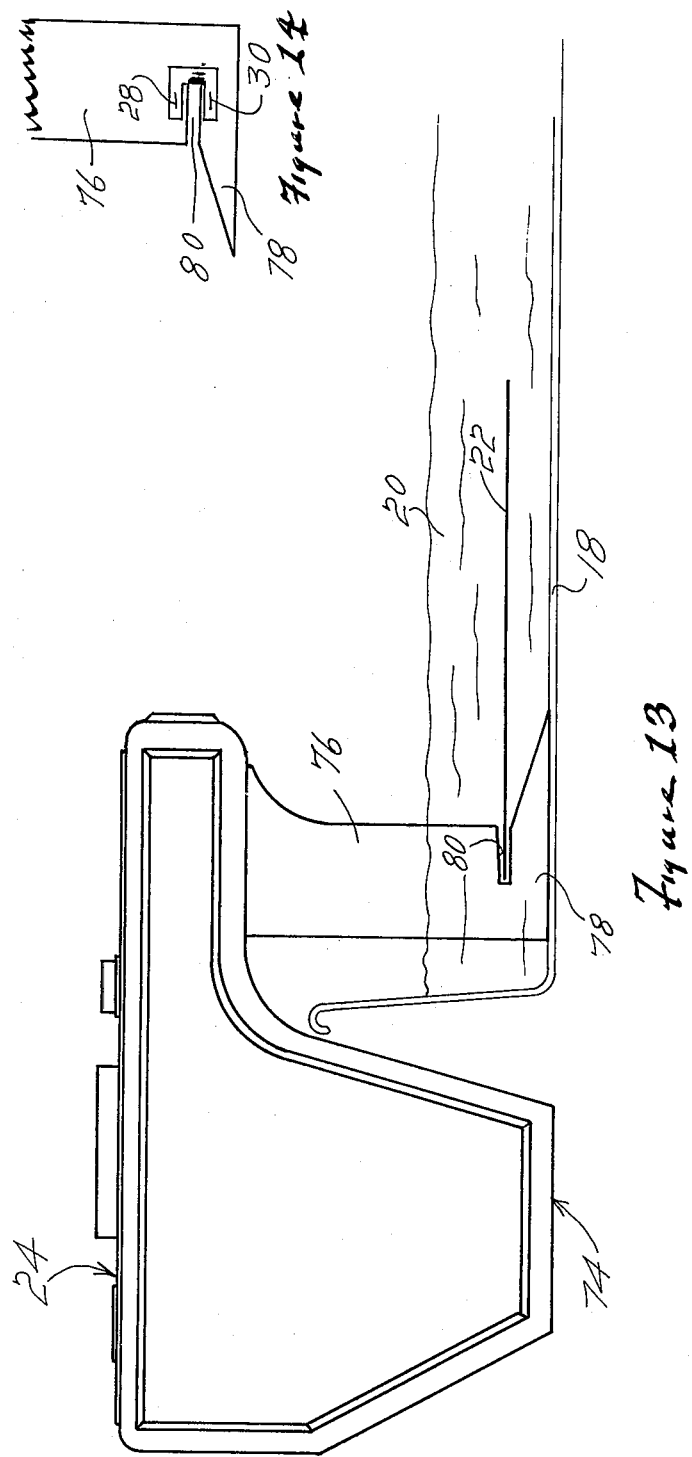

ELECTRICAL APPARATUS FOR COMPARING DARK AND LIGHT AREAS ON A SUBSTRATE AND WHICH SUBSTRATE IS IN A LIQUID

There is a co-pending patent application, Ser. No. 952,220, filing date of Oct. 17, 1978, entitled "A PROCESS COLOR SEPARATOR".

THE BACKGROUND OF THE INVENTION

In the printing of an illustration onto a substrate such as paper, there is prepared a printing plate. For a colored illustration, there are a plurality of printing plates. Normally, the number of printing plates is three printing plates, viz., a blue printing plate, a yellow printing plate and a red printing plate. Sometimes there may be used a fourth printing plate referred to as a black printing plate. For example, blue has a wave length range of about three thousand to four thousand angstroms; yellow has a wave length range of about four thousand to five thousand angstroms; and, red has a wave length range of about six thousand to seven thousand angstroms. It is to be understood that there is some overlapping in these ranges, but the approximate ranges are as above described.

The reader is to understand that in the making of a colored illustration there may be more than three printing plates. In some printing shops in the making of a colored illustration there may be as many as nine printing plates so as to be able to print all of the colored dots onto the substrate as required to give a good illustration of the subject matter. With nine printing plates it is possible to have a more complete total range or a more complete spectrum of the colors and a reproduction of the original subject matter.

The preparation of the printing plates for printing the illustration requires the step of making screen separation negatives. Generally, there is prepared a screen separation negative. For a black and white print, there is required one negative or one screen negative. A black and white illustration is monochrome printing or one color. For a colored illustration there is a minimum of two screen separation negatives and for a complete color range from about three thousand to seven thousand angstroms wave length range there is required a minimum of three separation negatives or three screen separation negatives, and in many instances, more than three screen separation negatives are prepared, i.e., as many as nine screen separation negatives, to have a larger tonal range and a larger spectrum of color in the resulting colored illustration.

Again, the reader is to understand that in viewing a colored print the reader is viewing dots of ink on a substrate, and, sometimes the colored dots of ink overlie each other.

In viewing a colored photograph the reader is viewing continuous color and not discrete dots of ink. This invention can be used in the developing of a colored photograph to a desired opaque area and clear area.

From the consideration of cost it is less expensive to make 100,000 colored prints of a subject than to make 100,000 colored photographs of said subject.

THE GENERAL DESCRIPTION OF THE INVENTION

With my invention the dots in a negative, i.e., the opaque area and the clear area of the exposed film in the screen separation negatives are developed to a predetermined standard. With the development of these dots to the predetermined standard for dots, such as a shadow dot developed to a predetermined standard and a hi-light dot developed to a predetermined standard, the middle tone of the grey scale will not, noticeably, shift. Therefore, the dot structure in the screen separation negative is a satisfactory dot structure and as a result of this the dots on the resulting printing plate will be satisfactory.

THE OBJECTS AND THE ADVANTAGES

One of the primary objects in using my apparatus is a saving in time required for making screen separation negatives from the resultant saving in labor required to make these screen separation negatives which results in a saving in cost or expenses; further, with my apparatus, it is possible to use less material in making the screen separation negatives than with other equipment; an additional object of my invention and apparatus is that it is possible to use less skilled labor in making the negatives than with other equipment; also, another advantage of my apparatus is that it is a more flexible apparatus than other equipment and that it is easier, with my apparatus, to correct errors than with other equipment; and, another advantage of my invention is that it is possible, potentially, to have a higher quality screen separation negative than with the conventional system as my system is more flexible and requires less time and material than the conventional system.

These and other important objects and advantages of the invention will be more, particularly, brought forth upon reference to the specific description of the invention and the appended claims.

THE DRAWINGS

IN THE DRAWINGS:

FIG. 5 is a schematic illustration of an electrical circuit which is used for comparing the hi-light dots in a film being developed to form a screen separation negative and which hi-light dots are being compared with a predetermined standard for dot structure;

FIG. 6 is a block diagram of the electrical circuitry of FIG. 5;

FIG. 11 is a front-elevational view of the apparatus;

FIG. 12 is a rear-elevational view of the apparatus;

FIG. 13 is a fragmentary illustration of a developing tray, developing solution in the developing tray, the apparatus is positioned so that the depending leg and foot of the apparatus are in the developing solution and with a film undergoing development in the recess in the depending leg and foot of the apparatus; and, FIG. 14 is a fragmentary view illustrating the source of infra-red light and also the solid state device which has a spectral peak sensitivity in the infra-red range used in the apparatus.

THE SPECIFIC DESCRIPTION OF THE INVENTION

With my invention the camera is calibrated so as to make a screen separation negative and from which screen separation negative there is prepared a printing plate which will print, approximately, ten percent dots in the light end or shadow end and, approximately, ten percent dots in the dark end or hi-light end. The reader is to understand that the film used for making the screen separation negative is panchromatic lithographic film which, in itself, is black and white film. Also, the reader is to understand that, in making the screen separation negatives, there is a dot structure on the negative and that a ten percent (10%) dot structure is the black area of the negative represents the whitest part of the original and will be the whitest part of the positive and of the printing plate. Likewise, a ten percent (10%) dot structure in the white area of the negative represents the blackest part of the original and will be the blackest part of the positive and of the printing plate.

Figure 1:
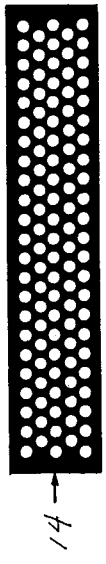
FIG. 1 is a screen separation negative for the shadow dot area and illustrates the black dots on the white background.
Figure 2:
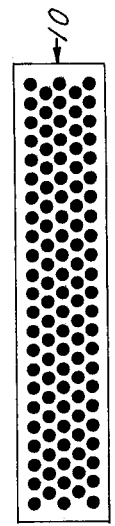
FIG. 2 illustrates a printing plate for the shadow dot area and which printing plate has been prepared from the screen separation negative of FIG. 1 and illustrates the white dots on the black background.
Figure 3:
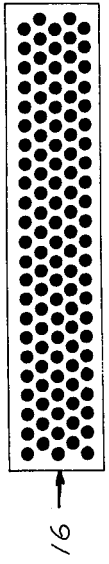
FIG. 3 is a screen separation negative for the hi-light dot area and illustrates white dots on a black background.
Figure 4:
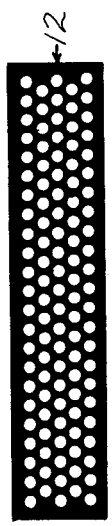
FIG. 4 is a printing plate for a hi-light dot area and which printing plate has been prepared from the screen separation negative of FIG. 3 and illustrates the black dots on the white background.
Figure 7:
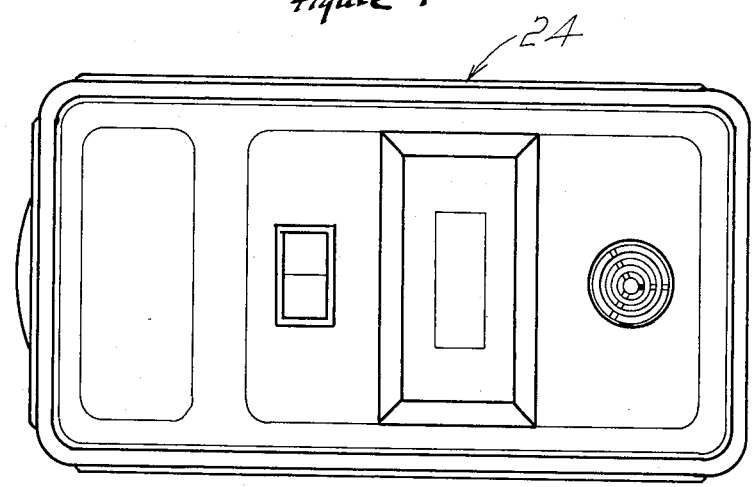
FIG. 7 is a top-plan view of the apparatus.
Figure 8:
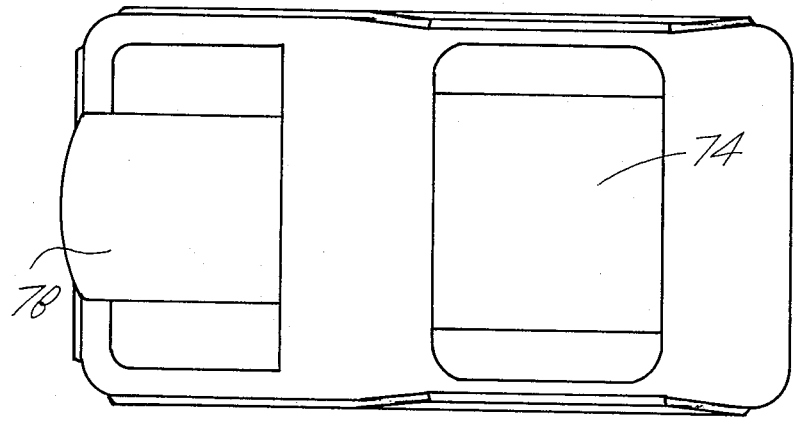
FIG. 8 is a bottom-plan view of the apparatus.
Figure 9:
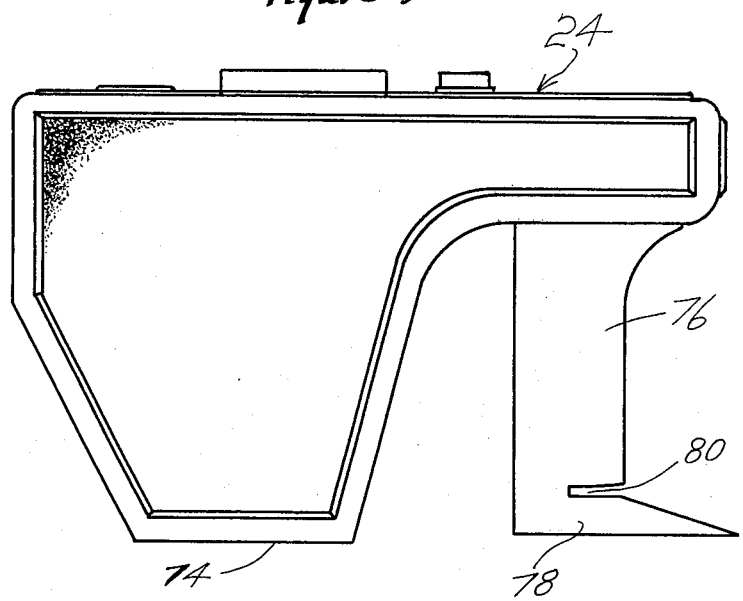
FIG. 9 is a first-side elevational view of the apparatus.
Figure 10:
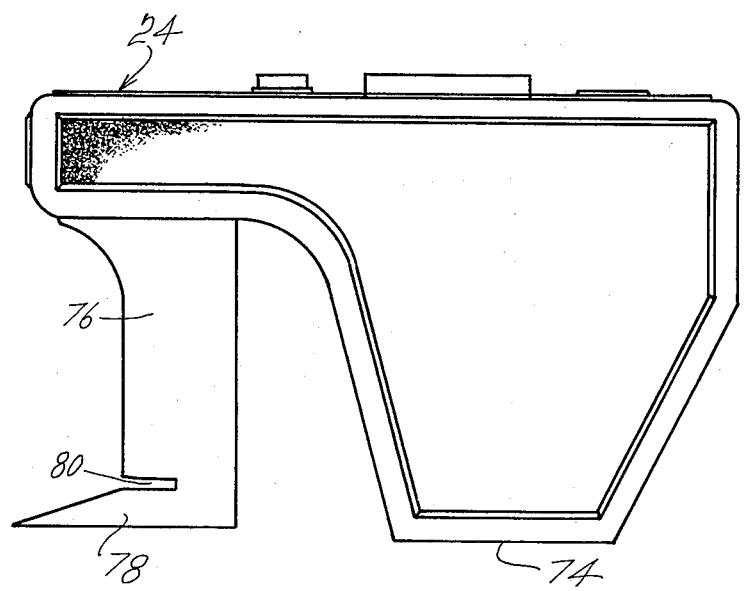
FIG. 10 is a second-side elevational view of the apparatus.

To assist the reader in understanding the calibration of the camera and the dot structure, there is illustrated in FIGS. 1 and 2 the shadow dot structure and there is illustrated in FIGS. 3 and 4 the hi-light dot structure.

In FIG. 1 there is illustrated a screen separation negative for the shadow dot structure and it is seen that there are black dots against a white background. Then, in FIG. 2 there is illustrated the shadow dot structure on a printing plate. The black dots in FIG. 1, in the screen separation negative, become the white dots in the printing plate in FIG. 2. In the printing plate in FIG. 2 the white dots are not printed onto the colored illustration. The black area in the printing plate of FIG. 2 is printed onto the substrate, viz., the paper. The color of the printed material in the printed illustration on the substrate is determined by the ink which is transferred to the black area of the printing plate in FIG. 2 and from the black area of the printing plate of FIG. 2 this ink is transferred to the substrate, viz., the paper.

In FIGS. 3 and 4 there is illustrated the hi-light dot area. In FIG. 3 there is illustrated a screen separation negative showing white dots. In FIG. 4 there is illustrated a printing plate made from the screen separation negative of FIG. 3. In FIG. 4 it is seen that there are black dots on a white background. In printing from the printing plate of FIG. 4 ink is transferred to the black dots on the printing plate and then the ink is transferred from the black dots on the printing plate to the substrate, viz., the paper.

In FIG. 1 the screen separation negative 10 shows black dots on a white background. In the preparation of the printing plate 12, see FIG. 2, from the screen separation negative 10 there are white dots on a black background. In FIG. 3 there is a screen separation negative 14 with white dots on a black background. The printing plate 16, see FIG. 4, is prepared from the screen separation negative 14 and the white dots of the screen separation negative 14 become the black dots on the printing plate 16. In FIG. 2 the ink is transferred to the black area of the printing plate 12 and the ink is transferred from the black area of the printing plate 12 to the substrate. In FIG. 4 the printing ink is transferred to the black dot on the printing plate and then the printing ink is transferred from the black dots on the printing plate to the substrate.

The reader is to understand that the predetermined standard for the dot structure or the predetermined dot structrue in the screen separation negative is the standard for which the apparatus is calibrated. This predetermined standard for the dot structure or the predetermined dot structure makes it possible to have a screen separated negative which is independent of outside influences. In the predetermined dot structure the light or white dots in the shadow dot screen separated negative, see FIG. 1, and the dark dots in the hi-light dot screen separated negative, see FIG. 3, are compared with the predetermined standard for the dot structure. When the exposed and flashed film has been developed in the developing solution so that the dots correspond to the predetermined standard for dot structure or the predetermined dot structure the operator can stop the developing of the exposed and flashed film as this exposed and flashed film has now reached the standard required for the screen separated negative. The apparatus indicates when the dot structure, viz., opaque area and clear area, on the developing screen separation negative reaches a predetermined standard for dot structure on a predetermined standard of transparency to light.

The reader is to, clearly, understand that the hi-light dot structure in the developing film to form the screen separation negative 14 is sampled or monitored and compared with a predetermined standard for dot structure.

In FIG. 13 there is illustrated a developing tray 18. In the developing tray 18 there is a developing solution 20. A film 22 is in the developing solution and is being developed to form the screen separation negative 14. A part of the film 22 is monitored or sampled to determine the dot structure and to compare this dot structure in the film 22 with a predetermined standard for dot structure. When the dot structure in the film 22 is at the same standard as a predetermined standard for the dot structure for the hi-light dot area then the film 22 is removed from the developing solution 20 and there is the screen separation negative 14. As, previously, stated the printing plate 16 can be prepared from the screen separation negative 14.

A comparison of FIGS. 3 and 4 shows that the dark area in the screen separation negative 14 becomes the light area in the printing plate 16 and that the light area in the screen separation negative 14 becomes the dark area in the printing plate 16.

To assist the operator in knowing when the dot structure in the developing film 22 corresponds to the dot structure in the predetermined standard for dot structure for the hi-light dot area there is used an electrical apparatus for comparing dark and light areas 24. In the apparatus 24 there is an electrical circuit 26. The electrical circuit 26 comprises an infra-red light emitting diode 28 and a Darlington phototransistor 30. The 120 ohm resistor 32 connects with the light emitting diode 28. The 10 Kohm resistor 32 connects with the phototransistor 30 by means of electrical line 38. The electrical line 38 connects with a 5 volt source of electricity such as a battery 40. The battery 40 connects with the ground 42. Also, the line 36 connects with the ground 42. The phototransistor 30 connects with the negative of a Norton amplifier 44 by means of line 46. The line 46 by means of line 48 connects with an analog digital converter 50. The Norton amplifier, at the positive side, by means of line 52 connects with 10K resistor 54. There is a variable potentiometer 56 which connects with the 5 volt source 40 of electricity and also connects with the ground 42. The 10K resistor 54 connects with the potentiometer 56.

The line 52 connects with the 1 M ohm resistor 58. Also, the output of Norton amplifier 44 connects with the line 60. The line 60 connects with the 10K resistor 62. The 1 Meg resistor 58 connects with the line 60 by means of line 64. The 10K resistor 62 connects with the base of NPN transistor 66, a 2N2222A transistor. The emitter of the transistor 66 connects with ground 42. The collector of the transistor connects with an indicator such as an audio generator 68, an NP 48. The audio generator 68 connects with the 5 volt source of electricity 40.

In place of an audio generator 68 there may be used an electric light 70. The audio generator 68 and the electric light 70 indicate when the dot structure in the developing film 22 is, substantially, the same as the dot structure in the predetermined standard for dot structure.

In using the apparatus 24, the potentiometer 56 may be set to a preselected setting or voltage setting. This preselected setting is the predetermined standard for dot structure for the film 22 and the resulting screen separated negative 14. In use, the light emitting diode 28 and the Darlington phototransistor 30 are placed in the developing solution 20 and the film 22 is placed between the light emitting diode 28 and the Darlington phototransistor 30. The film 22 develops and the dot structure becomes more pronounced and decisive with the development of the film. When the hi-light dot structure in the film 22 reaches a predetermined standard for dot structure, the audio generator 68 emits a signal to warn the operator or to call the attention of the operator to the fact that the dot structure has reached the predetermined standard dot structure. Then, the operator can remove the film 22 from the developing solution 20. The film 22 has become the screen separation negative 14. In place of the audio generator 68, the light 70 may go on or go off to indicate to the operator that the film 22 has developed to meet the predetermined standard for dot structure and the film 22 should be removed from the developing solution 20.

As is well known in the developing of film, the film 22, after being removed from the developing solution 20, should be washed and then placed in a fixer solution so as to stop all development of the negative. In FIG. 6 there is illustrated a block diagram of the electrical circuitry of FIG. 5. It is seen in FIG. 6 that the light emitting diode 28 and the Darlington phototransistor 30 are now labeled the panchromatic compatable transciever. Then, the constant current generator 40 can be the battery 40 or another suitable source of voltage such as a source of 5 volts direct current. The analog sampling-digital converter 50 of the circuit 26. Then, the Norton amplifier 44 and 1 M ohm resistor 58 are the analog comparator with hysteresis 44-58 in the block diagram. The potentiometer 56 of the circuit 26 is the reference voltage with threshold control 56 in the block diagram. And, the audio generator 68 or the light emitting light bulb 70 are the electrical to mechanical transducer 68-70 in the block diagram.

The apparatus 24 comprises a housing 72 which has a base 74. Also, there depends from the housing 72 a depending leg 76 which terminates at its lower end in a foot 78. In the leg 76 there is a recess 80. As, previously, explained the depending leg 76 and the foot 78 are immersed in the developing solution in the developing tray 18. Then, an edge of the exposed film 22 is placed in the recess 80 between the infra-red light emitting diode 28 and the Darlington phototransistor 30, see FIG. 5. When the dot structure in the film reaches the predetermined standard for dot structure in the hi-light dot area, see FIG. 3, then screen separation negative 14 is ready to be removed from the developing solution 20, washed and set in a fixer solution to set the screen separation negative 14.

From the foregoing it is seen that the apparatus 24 electronically determines the development progression of exposed film, viz., a pre-screen half tone screen negative, while it is immersed in a liquid type of developer 20. The determination of the development of the pre-screen half toned screen negative is directly related to the capability of the dot size a printing press can reproduce. This determination is displayed on a digital display reading in percentage dot size and compared with a predetermined standard for dot structure. When the dot structure in the film undergoing development meets the predetermined standard for dot structure for the hi-light dot area in the screen separation negative 14 the apparatus 24 gives an indication so that the operator can remove the developed film from the developing solution for washing and fixing.

By way of summary, there is now made reference to FIG. 14 of the drawings which shows in more detail the depending leg 76, the foot 78 and the recess 80 for receiving the substrate 22. The depending leg 76 and foot 78 are made of plastic. The infra-red light emitting diode 30 and the solid state device which peaks in to spectral range of infra-red 28 are encased in a transparent plastic such as epoxy plastic. These elements 28 and 30 are then placed in a horseshoe shaped member or a U-configuration member so that one is on one side of the recess 80 and the other is on the other side of the recess 80. The developing film 22 can be placed between the elements 28 and 30. With the depending leg 76 and the foot 78 being plastic and the elements 28 and 30 being encased in a transparent epoxy, the parts are not corroded by the developing solution 20.

The apparatus and its use have been described and illustrated with respect to a screen separation negative and the viewing of opaque area and clear area in the developing negative. The developing of a continuous tone negative and a white negative or a colored negative can, also, be monitored and tested for opaque area and clear area with this apparatus.

From the foregoing and having presented my invention, I claim:

1. An apparatus for comparing opaque area and clear area on a substrate with a predetermined standard of transparency to light, said apparatus comprising:
   a. a source of infra-red light and a solid state device with a spectral response peak in the infra-red region;
   b. said source of infra-red light and said solid state device being spaced apart so as to be capable of receiving an edge of said substrate between them;
   c. said substrate being immersed in a developing solution;

d. said infra-red light continuously travels through the developing solution between the source of said infra-red light and the edge of the substrate, the edge of the substrate and the developing solution between the edge of the substrate and the solid state device;

e. said predetermined standard of transparency being a dot structure in the substrate;

f. an indicator, operatively, connecting with said solid state device; and, g. said indicator indicating when the dot structure in said substrate meets said predetermined standard of transparency.

2. An apparatus according to claim 1 and comprising:
a. a source of electricity;
b. direct current electricity from said source of electricity;
c. said source of infra-red light connecting with said source of electricity;
d. an analog-digital conversion, operatively, connecting with said solid state device;
e. an analog comparator with hysteresis, operatively, connecting with said solid state device; and,
f. a reference voltage with threshold control, operatively, connecting with said analog comparator with hysteresis.

3. An apparatus according to claim 1 and comprising:
a. said source of infra-red light and said solid state device being positioned in a transparent material so as to be capable of being immersed in a liquid and for receiving said substrate while in said liquid.

4. An apparatus according to claim 1 and comprising:
a. said source of infra-red light being an infra-red light emitting device; and,
b. said solid state device being a Darlington phototransistor.

5. An apparatus according to claim 1 and comprising:
a. a source of electricity;
b. direct current electricity from said source of electricity;
c. said source of infra-red light connecting with said source of electricity;
d. an analog-digital conversion, operatively, connecting with said solid state device;
e. an analog comparator with hysteresis, operatively, connects with said solid state device;
f. a reference voltage with threshold control, operatively, connecting with said analog comparator with hysteresis;
g. said source of infra-red light and said solid state device being positioned in a transparent material so as to be capable of being immersed in a liquid and for receiving said substrate while in said liquid;
h. said source of infra-red light being an infra-red light emitting device; and,
i. said solid state device being a Darlington phototransistor.

6. A combination of a substrate having an opaque and a clear area and an apparatus for comparing opaque area and clear area on a substrate with a predetermined standard of transparency to light, said apparatus comprising;
a. a source of infra-red light and a solid state device with a spectral response peak in the infra-red region;
b. said source of infra-red light and said solid state device being spaced apart so as to be capable of receiving an edge of said substrate between them;
c. said substrate being between said source of infra-red light and said solid state device;
d. said substrate being immersed in a developing solution;
e. said infra-red light continuously travels through the developing solution between the source of said infra-red light and the edge of the substrate, the edge of the substrate and the developing solution between the edge of the substrate and the solid state device;
f. said predetermined standard of transparency being a dot structure in the substrate;
g. an indicator, operatively, connecting with said solid state device; and,
h. said indicator indicating when the dot structure in said substrate meets said predetermined standard of transparency.

7. A combination according to claim 6 and comprising:
a. a source of electricity;
b. direct current electricity from said source of electricity;
c. said source of infra-red light connecting with said source of electricity;
d. an analog-digital conversion, operatively, connecting with said solid state device;
e. an analog comparator with hysteresis, operatively, connecting with said solid state device; and,
f. a reference voltage with threshold control, operatively, connecting with said analog comparator with hysteresis.

8. A combination according to claim 6 comprising:
a. said source of infra-red light and said solid state device being positioned in a transparent material so as to be capable of being immersed in a liquid and for receiving said substrate while in said liquid.

9. A combination according to claim 6 and comprising:
a. said source of infra-red light being an infra-red light emitting device; and,
b. said solid state device being a Darlington phototransistor.

10. An apparatus according to claim 1 and comprising:
a. a source of electricity;
b. direct current electricity from said source of electricity;
c. said source of infra-red light connecting with said source of electricity;
d. an analog-digital conversion, operatively, connecting with said solid state device;
e. an analog comparator with hysteresis, operatively, connects with said solid state device;
f. a reference voltage with threshold control, operatively, connecting with said analog comparator with hysteresis;
g. said source of infra-red light and said solid state device being positioned in a transparent material so as to be capable of being immersed in a liquid and for receiving said substrate while in said liquid;
h. said source of infra-red light being an infra-red light emitting device; and,
i. said solid state device being a Darlington phototransistor.

11. A separation negative prepared by:
a. placing a screen over unexposed panchromatic lithographic film and on that side of the unexposed panchromatic lithographic film facing an object to be photographed;

b. exposing the film to light waves from the object to be photographed to form exposed film;

c. developing said film;

d. in developing said film testing said film with an apparatus for comparing opaque area and clear area on a substrate with a predetermined standard of transparency to light and wherein said apparatus comprises:

1. a source of infra-red light and a solid state device with a spectral response peak in the infra-red region;

2. said source of infra-red light and said solid state device being spaced apart so as to be capable of receiving an edge of said substrate between them;

3. said substrate being immersed in a developing solution;

4. said infra-red light continuously travels through the developing solution between the source of infra-red light and the edge of the substrate, the edge of the substrate and the developing solution between the edge of the substrate and the solid state device;

5. said predetermined standard of transparency being a dot structure in the substrate;

6. an indicator, operatively, connecting with said solid state device; and, 7. said indicator indicating when the dot structure in said substrate meets said predetermined standard of transparency.

12. A separation negative prepared by the teaching of claim 11 wherein:

a. a source of electricity;

b. direct current electricity from said souce of electricity;

c. said source of infra-red light connecting with said source of electricity;

d. an analog-digital conversion, operatively, connecting with said solid state device;

e. an analog comparator with hysteresis, operatively, connecting with said solid state device; and, f. a reference voltage with threshold control, operatively, connecting with said analog comparator with hysteresis.

13. A separation negative prepared by the teaching of claim 12 wherein:

a. said source of infra-red light and said solid state device being positioned in a transparent material so as to be capable of being immersed in a liquid and for receiving said substrate while in said liquid.

14. A separation negative prepared by the teaching of claim 12 wherein:

a. said source of infra-red light being an infra-red light emitting device; and, b. said solid state device being a Darlington phototransistor.

15. A separation negative prepared by the teaching of claim 11 wherein:

a. a source of electricity;

b. direct current electricity from said source of electricity;

c. said source of infra-red light connecting with said source of electricity;

d. an analog-digital conversion, operatively, connecting with said solid state device;

e. an analog comparator with hysteresis, operatively, connects with said solid state device;

f. a reference voltage with threshold control, operatively, connecting with said analog comparator with hysteresis;

g. said source of infra-red light and said solid state device being positioned in a transparent material so as to be capable of being immersed in a liquid and for receiving said substrate while in said liquid;

h. said source of infra-red light being an infra-red light emitting device; and, i. said solid state device being a Darlington phototransistor.

* * * * *